(12) United States Patent
Choudhary et al.

(10) Patent No.: US 9,148,154 B2
(45) Date of Patent: Sep. 29, 2015

(54) DELAY-LOCKED LOOP WITH INDEPENDENT PHASE ADJUSTMENT OF DELAYED CLOCK OUTPUT PAIRS

(71) Applicant: MoSys, Inc., Santa Clara, CA (US)

(72) Inventors: Prashant Choudhary, Milipitas, CA (US); Aldo Bottelli, Redwood City, CA (US); Charles W Boecker, Ames, IA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 14/231,739

(22) Filed: Mar. 31, 2014

(65) Prior Publication Data

US 2014/0210531 A1    Jul. 31, 2014

Related U.S. Application Data

(63) Continuation of application No. 13/720,981, filed on Dec. 19, 2012, now Pat. No. 8,704,570.

(60) Provisional application No. 61/578,216, filed on Dec. 20, 2011, provisional application No. 61/582,352, filed on Dec. 31, 2011, provisional application No. 61/662,338, filed on Jun. 20, 2012.

(51) Int. Cl.
| | |
|---|---|
| *H03L 7/06* | (2006.01) |
| *H03L 1/00* | (2006.01) |
| *H03L 7/07* | (2006.01) |
| *H03L 7/081* | (2006.01) |
| *H04L 7/033* | (2006.01) |
| *H03L 7/08* | (2006.01) |

(52) U.S. Cl.
CPC .. *H03L 1/00* (2013.01); *H03L 7/07* (2013.01); *H03L 7/08* (2013.01); *H03L 7/0816* (2013.01); *H04L 7/0338* (2013.01)

(58) Field of Classification Search
USPC .................................................. 327/149, 150
See application file for complete search history.

(56) References Cited

U.S. PATENT DOCUMENTS

| | | | | |
|---|---|---|---|---|
| 6,977,558 | B2* | 12/2005 | Cranford et al. | 331/186 |
| 8,031,007 | B2* | 10/2011 | Chang et al. | 331/1 A |
| 8,362,848 | B2* | 1/2013 | Raghunathan et al. | 331/186 |
| 8,537,957 | B2* | 9/2013 | Lesso | 375/376 |
| 8,704,570 | B2 | 4/2014 | Bottelli et al. | 327/158 |
| 2004/0158757 | A1* | 8/2004 | Lin | 713/401 |
| 2004/0232995 | A1* | 11/2004 | Thomsen et al. | 331/2 |
| 2005/0046489 | A1* | 3/2005 | Cranford et al. | 331/25 |
| 2005/0141636 | A1* | 6/2005 | Minami et al. | 375/295 |

(Continued)

*Primary Examiner* — Adam Houston

(57) ABSTRACT

A delay-lock loop includes two feedback loops for controlling delay elements in the delay-lock loop. The first feedback loop includes a feedback circuit for generating a feedback signal indicating a delay adjustment based on a phase difference between an input clock signal to the delay-locked loop and an output clock signal generated by the delay-locked loop. The second feedback loop includes a power regulator that generates a regulated signal by regulating a power supply using the feedback signal as a reference. The delay-lock loop further includes a variable delay circuit including a resistor-capacitor network. The variable delay circuit controls a capacitance in the resistor-capacitor network based on the feedback signal and controls a resistance of the resistor-capacitor network based on the regulated signal. In this way, variable delay circuit generates the output clock signal by delaying the input clock signal based on both the feedback signal and the regulated signal.

23 Claims, 14 Drawing Sheets

(56) References Cited

U.S. PATENT DOCUMENTS

2008/0315928 A1* 12/2008 Waheed et al. ............... 327/159
2008/0315960 A1* 12/2008 Waheed et al. ................ 331/17
2012/0177157 A1* 7/2012 Muhammad ................. 375/345
2013/0027099 A1* 1/2013 Wang et al. .................. 327/156
2013/0154698 A1* 6/2013 Bottelli et al. ................ 327/157

* cited by examiner

DELAY-LOCKED LOOP WITH INDEPENDENT PHASE ADJUSTMENT OF DELAYED CLOCK OUTPUT PAIRS

CROSS-REFERENCE TO RELATED APPLICATIONS

This application claims priority to U.S. non-provisional application Ser. No. 13/720,981, filed Dec. 19, 2012, entitled: "DELAY-LOCKED LOOP WITH PHASE ADJUSTMENT", and to provisional application Ser. No. 61/578,216, filed Dec. 20, 2011, entitled: "Dual Loop DLL; Ser. No. 61/582,352, filed Dec. 31, 2011, entitled: "Delay-Locked Loop with Dual Feedback Controls"; Ser. No. 61/662,338, filed Jun. 20, 2012, entitled: "Delay-Locked Loop with Phase Offsets", which applications are also incorporated by reference herein in their entirety.

BACKGROUND

Delay-locked loops (DLLs) are often employed in integrated circuit devices to change the phase of a reference clock signal. In operation, a delay-locked loop generates an output clock signal based on an input clock signal to the delay-locked loop. The delay-locked loop generates an error signal by comparing the phase of the input clock signal to the phase of an output clock signal. Additionally, the delay-locked loop integrates the error signal and controls the delay of the input clock signal through a chain of delay elements based on the integrated error signal.

Phase-locked loops (PLLs) are also employed in integrated circuit devices to change the phase of a reference clock signal. Unlike a delay-locked loop, a phase-locked loop includes a voltage-controller oscillator. In operation, the phase-locked loop generates an error signal by comparing the phase of an oscillating clock signal generated by the voltage controlled oscillator with the phase of an input clock signal to the phase-locked loop. Additionally, the phase-lock loop generates a control signal for the voltage controlled oscillator by integrating the error signal. Because the control signal controls the frequency of the oscillating signal generated by the voltage controlled oscillator, the voltage controlled oscillator performs an integration in the phase-locked loop. Generally, a phase-locked loop performs two integrations but a delay-locked loop performs only a single integration. Thus the phase-locked loop is a second order feedback system while the delay locked loop is a first order feedback system.

In integrated circuit implementations, a delay-locked loop adjusts the error signal generated in a feedback loop of the delay-locked loop to compensate for voltage, temperature, and process variations across the integrated circuit. Because voltage, temperature, and process variations are generally independent of each other in an integrated circuit, the error signal generated by the delay-locked loop may not adjust to all these variations quickly enough to achieve phase-lock of the output clock signal to the input clock signal or have enough range to cover the variation.

SUMMARY

In various embodiments, a delay-lock loop includes two feedback loops for controlling delay elements in the delay-lock loop. The first feedback loop includes a feedback circuit for generating a feedback signal indicating a delay adjustment based on a phase difference between an input clock signal to the delay-locked loop and an output clock signal generated by the delay-locked loop. The second feedback loop includes a power regulator that generates a regulated signal based on the feedback signal. The delay-lock loop further includes a variable delay circuit including a chain of delay elements. Furthermore, the chain of delay elements forms a resistor-capacitor network in the variable delay circuit. The feedback signal generated in the first feedback loop controls a capacitance of the resistor-capacitor network, and the regulated signal controls a resistance of the resistor-capacitor network. In this way, the delay of the input clock signal through the chain of delay elements is controlled by both the feedback signal and the regulated signal.

In operation, the feedback signal generated in the first feedback loop and the regulated signal generated in the second feedback loop each compensates for temperature and voltage variations in an integrated circuit device including the delay-locked loop. The second feedback loop has a higher low-frequency gain and delay range than the first feedback loop but the first feedback loop has less filtering than the second feedback loop for filtering out higher frequency components. As a result, the first feedback loop responds more quickly to temperature and voltage variations than the second feedback loop. Although the second feedback loop responds less quickly to temperature and voltage variations than the first feedback loop, the second feedback loop compensates for higher temperature and voltage changes (e.g., fluctuations) than the first feedback loop. Because the delay-locked loop has two distinct feedback controls that compensate for voltage and temperature variations in the integrated circuit and each of the feedback controls has different characteristics for compensating for voltage and temperature variations over different frequency ranges, the delay-locked loop responds to both low frequency and high frequency variations of varying magnitude in the integrated circuit, with a wider frequency and delay range than other types of delay-locked loops having only a single feedback control.

A system, in accordance with one embodiment, includes a delay-locked loop. The delay locked loop includes a feedback circuit, a power regulator, and a variable delay circuit. The feedback circuit is configured to generate a feedback signal indicating a delay adjustment based on a phase difference between an input clock signal and an output clock signal. The power regulator is configured to generate a regulated signal by regulating a power supply using the feedback signal as a reference. The variable delay circuit is configured to generate the output clock signal by delaying the input clock signal based on the feedback signal and the regulated signal.

A method, in accordance with one embodiment, includes generating a feedback signal in a delay-locked loop. The feedback signal indicates a delay adjustment based on a phase difference between an input clock signal of the delay-locked loop and an output clock signal of the delay-locked loop. The method also includes generating a regulated signal by regulating a power supply using the feedback signal as a reference. Further, the method includes generating the output clock signal by delaying the input clock signal based on the feedback signal and the regulated signal.

A system, in accordance with one embodiment, includes a means for generating a feedback signal in a delay-locked loop. The feedback signal indicates a delay adjustment based on a phase difference between an input clock signal to the delay-locked loop and an output clock signal of the delay-locked loop. The system further includes a means for generating a regulated signal by regulating a power supply using the feedback signal as a reference and a means for generating the output clock signal by delaying the input clock signal based on the feedback signal and the regulated signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a delay-lock loop includes two feedback loops for controlling delay elements in the delay-lock loop. The first feedback loop includes a feedback circuit for generating a feedback signal indicating a delay adjustment based on a phase difference between an input clock signal to the delay-locked loop and an output clock signal generated by the delay-locked loop. The second feedback loop includes a power regulator that generates a regulated signal by regulating a power supply using the feedback signal as a reference. The delay-lock loop further includes a variable delay circuit including a resistor-capacitor network. The variable delay circuit controls a capacitance in the resistor-capacitor network based on the feedback signal and controls a resistance of the resistor-capacitor network based on the regulated signal. In this way, variable delay circuit generates the output clock signal by delaying the input clock signal based on both the feedback signal and the regulated signal.

In various embodiments, the delay-locked loop is implemented in an integrated circuit device. Many DLLs use the regulated voltage to change the delay of the DLL. When this is done, there is usually an upper frequency at which the DLL can respond to the feedback signal. This is due to the regulator having multiple poles at low frequencies and the requirement that the loop needs to be stable. In one embodiment, another loop is added that only contains very high frequency poles, but has a much smaller frequency response range. In this way, a DLL with a higher frequency response can be created, that still regulates the supply to the DLL. Thus, the present disclosure provides a DLL having a plurality of loops coupled together, wherein each of the loops has performance characteristics that are different from each other and that together provide a hybrid system with improved characteristics over a DLL with just a single loop. In one embodiment, a first loop has poles at a lower frequency than the poles of the second loop. In other words, one embodiment has a first loop with a frequency response that is narrower than a frequency response of a second loop.

Figure 1:
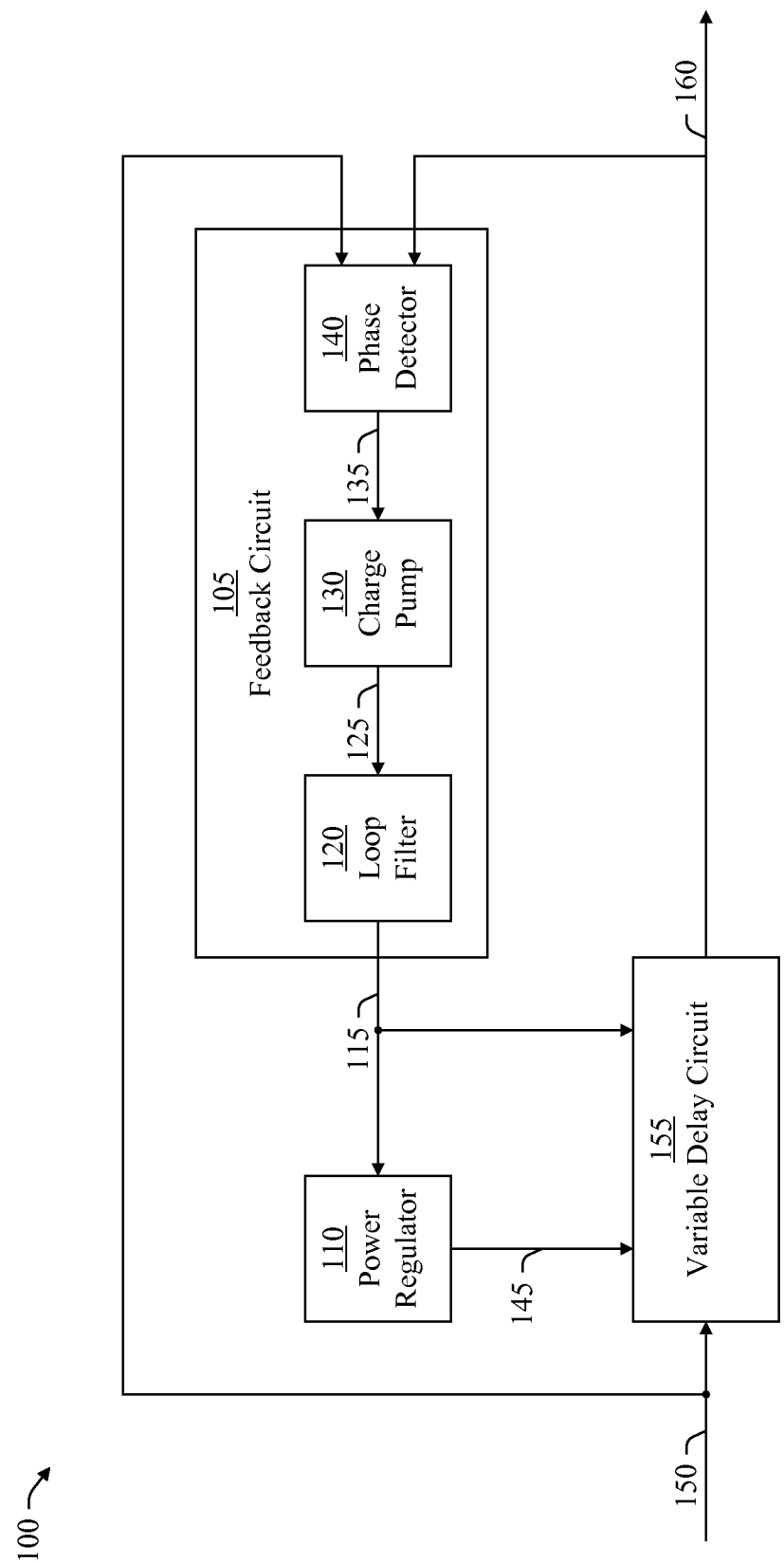
FIG. 1 is a block diagram of a delay-locked loop, in accordance with an embodiment of the present invention.

FIG. 1 illustrates a delay-locked loop 100, in accordance with an embodiment of the present invention. The delay-locked loop 100 includes a feedback circuit 105, a power regulator 110, and a variable delay circuit 155 coupled (e.g., connected) to each other. The feedback circuit 105 receives an input clock signal 150 and an output clock signal 160. Moreover, the feedback circuit 105 generates a feedback signal 115 indicating a delay adjustment for the variable delay circuit 155 based on a phase difference between the input clock signal 150 and the output clock signal 160. The feedback circuit 105 provides the feedback signal 115 to both the power regulator 110 and the variable delay circuit 155.

The power regulator 110 generates a regulated signal 145 by regulating a power supply using the feedback signal 115 as a reference. In one embodiment, the power regulator 110 generates the regulated signal 145 by regulating a voltage component of the power supply using the feedback signal 115 as a reference. In this embodiment the power regulator 110 includes a voltage regulator. In another embodiment, the power regulator 110 generates the regulated signal 145 by regulating a current of the power supply using the feedback signal 115 as a reference. In this embodiment, the power regulator 110 includes a current regulator. In yet another embodiment, the power regulator 110 regulates both a voltage component and a current component of the power supply using the feedback signal as a reference. In this embodiment, the power regulator 110 includes both a voltage regulator and a current regulator. The power regulator 110 provides the regulated signal 145 to the variable delay circuit 155.

The variable delay circuit 155 generates the output clock signal 160 by delaying the input clock signal 150 based on the feedback signal 115 and the regulated signal 145. In this process, the variable delay circuit 155 may shift a phase of the output clock signal relative to a phase of the input clock signal and generate a phase offset between the input clock signal 150 and the output clock signal 160. For example, the variable delay circuit 155 may be a voltage controlled delay line.

In various embodiments, the feedback circuit 105 includes a loop filter 120, a charge pump 130, and a phase detector 140. The phase detector 140 generates a phase signal 135 indicating a phase difference between the input clock signal 150 and the output clock signal 160. The phase detector 140 provides the phase signal to the charge pump 130. In some embodiments, the phase signal 135 may include more than one component signal, for example a signal to indicate a positive phase offset of the output clock signal 160 from the input clock signal 150 and another signal to indicate a negative phase offset of the output clock signal 160 from the input clock signal 150. In some embodiments, the phase detector 140 is a phase-frequency detector (PFD).

The charge pump 130 generates a charge pump signal 125 based on the phase signal 135. In various embodiments, the charge pump signal 125 includes a voltage component indicating the phase difference between the input clock signal 150 and the output clock signal 160. The charge pump 130 provides the charge pump signal to the loop filter 120. The loop filter 120 generates the feedback signal 115 by performing a low-pass filtering operation on the charge pump signal 125. For example, the loop filter 120 may include a low-pass filter. In various embodiments, the power regulator 110 includes a low-pass filter and performs a low-pass filtering operation on the feedback signal. For example, the cut-off frequency of the low-pass filter in the loop filter 120 may be higher than the cut-off frequency of the low-pass filter in the power regulator 110.

In various embodiments, the feedback circuit 105 in combination with the variable delay circuit 155 form a first-order feedback loop of the delay-locked loop 100 in which the feedback signal 115 is a feedback control signal. The feedback circuit 105 in combination with the power regulator 110 and the variable delay circuit 155 form a second order feedback loop of the delay-locked loop 100 in which the regulated signal 145 is a feedback control signal. In this way, the feedback loop excluding the power regulator 110 is a first order feedback system and the feedback loop including the power regulator 110 is a second order feedback system.

In various embodiments, the delay-locked loop 100 is implemented in an integrated circuit of an integrated circuit device which may include an integrated circuit package containing the integrated circuit. In some embodiments, the delay-locked loop 100 is implemented in a single integrated circuit die or chip. In other embodiments, the delay-locked loop 100 is implemented in more than one integrated circuit die or chip of an integrated circuit device which may include a multichip package containing the integrated circuit die or chips.

In various embodiments, the variable delay circuit 155 compensates for process, temperature, and voltage variations in the integrated circuit device based on the regulated signal 145 and the feedback signal 115. Although, the feedback signal 115 in the first order feedback loop of the delay-locked loop 100 responds more quickly than the regulated signal 145 in the second order feedback loop of the delay-locked loop 100, the second order feedback loop of the delay-locked loop compensates for larger variations (e.g. fluctuations) in the integrated circuit device. Because the delay-locked loop 100 has two distinct feedback controls (i.e., the feedback signal 115 and the regulated signal 145) that compensate for variations in the integrated circuit device and because each of the feedback controls is more responsive to either high frequency variations or large magnitude variations than the other feedback control, the delay-locked loop 100 is more robust to variations in the integrated circuit device over a given frequency range and magnitude range than other types of delay-locked loops having only a single feedback control. The robustness is reflected in a wider frequency range of operation and a faster response time.

Figure 2A:
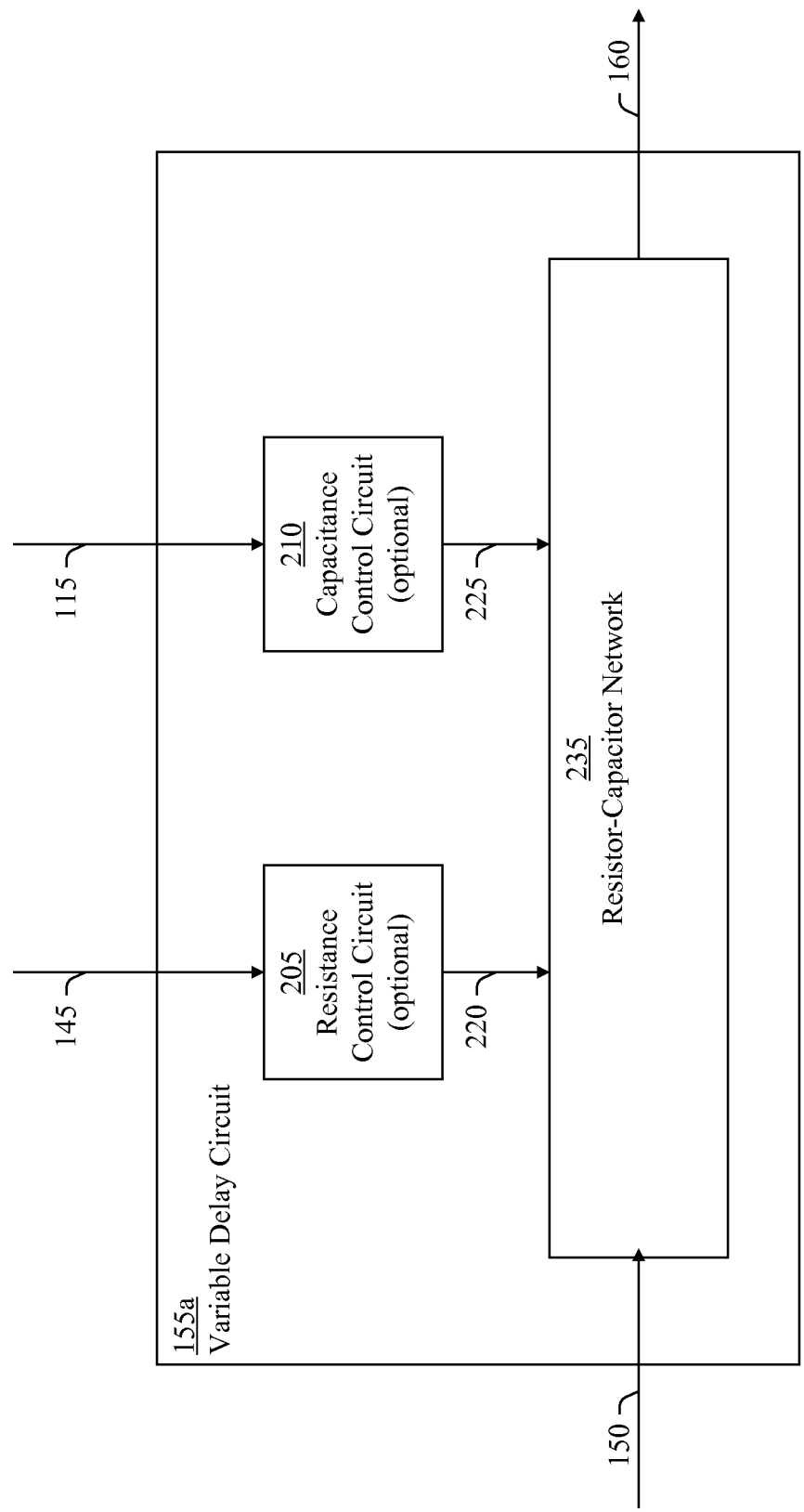
FIG. 2A is a block diagram of a variable delay circuit, in accordance with an embodiment of the present invention.

FIG. 2A illustrates the variable delay circuit 155a, in accordance with an embodiment of the present invention. The variable delay circuit 155a includes a resistor-capacitor network 235. The resistor-capacitor network 235 generates the output clock signal 160 by delaying the input clock signal 150 based on the feedback signal 115 and the regulated signal 145. For example, the resistor-capacitor network 235 may be a voltage-controlled delay line. The resistor-capacitor network 235 has a capacitance controlled by the feedback signal and has a resistance controlled by the regulated signal 145. Moreover, the resistor-capacitor network 235 has a resistor-capacitor (RC) time constant determined by the resistance and capacitance of the resistor-capacitor network 235 and which determines delay of the output clock signal 160 relative to the input clock signal 150. In this way, the resistor-capacitor network 235 generates the output clock signal 160 by delaying the input clock signal 150 depending on the RC time constant of the resistor-capacitor network 235.

In some embodiments, the variable delay circuit 155a includes an optional resistance control circuit 205. In these embodiments, the resistance control circuit 205 generates a resistance control signal 220 based on the regulated signal 145 and provides the resistance control signal 220 to the resistor-capacitor network 235. The resistance control signal 220 controls the resistance of the resistor-capacitor network 235. In various embodiments, the resistance control signal 220 may be an analog signal or a digital signal and may include more than one component signal. In some embodiments, the resistance control signal 220 includes both analog and digital component signals. In embodiments without the resistance control circuit 205, the resistance control signal 200 is the same as the regulated signal 145.

In some embodiments, the variable delay circuit 155a includes an optional capacitance control circuit 210. In these embodiments, the capacitance control circuit 210 generates a capacitance control signal 225 based on the feedback signal 115 and provides the capacitance control signal 225 to the resistor-capacitor network 235. The capacitance control signal 225 controls the capacitance of the resistor-capacitor network 235. In various embodiments, the capacitance control signal 225 may be an analog signal or a digital signal and may include more than one component signal. In some embodiments, the capacitance control signal 225 includes both analog and digital component signals. In embodiments without the capacitance control circuit 210, the capacitance control signal 225 is the same as the feedback signal 115.

Figure 2B:
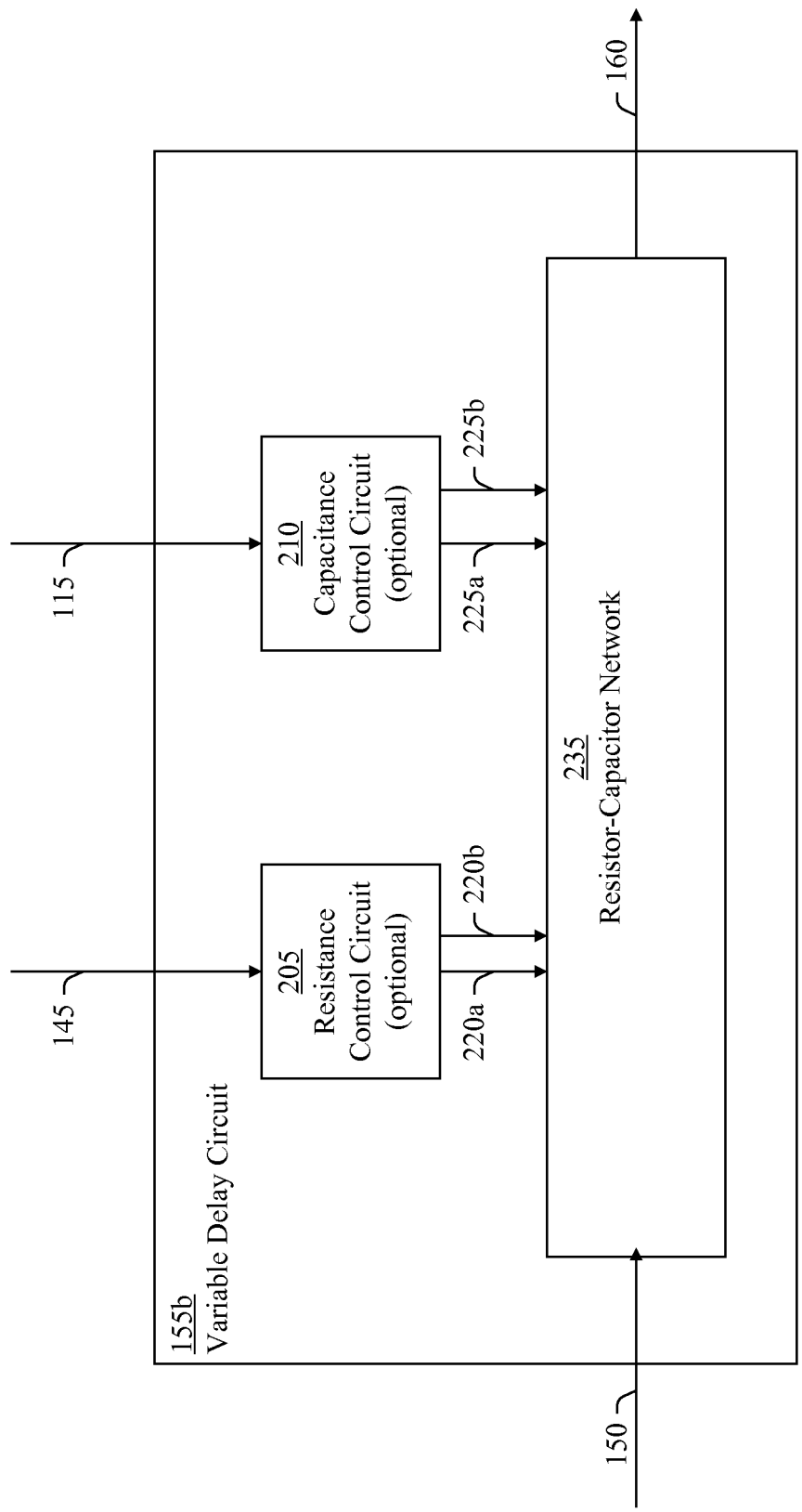
FIG. 2B is a block diagram of a variable delay circuit, in accordance with an embodiment of the present invention.

FIG. 2B illustrates the variable delay circuit 155b, in accordance with an embodiment of the present invention. The variable delay circuit 155b includes a resistor-capacitor network 235. The resistor-capacitor network 235 generates the output clock signal 160 by delaying the input clock signal 150 based on the feedback signal 115 and the regulated signal 145. For example, the resistor-capacitor network 235 may be a voltage-controlled delay line. The resistor-capacitor network 235 has a capacitance controlled by the feedback signal 115 and has a resistance controlled by the regulated signal 145. Moreover, the resistor-capacitor network 235 has a resistor-capacitor (RC) time constant determined by the resistance and capacitance of the resistor-capacitor network 235 and which determines delay of the output clock signal 160 relative to the input clock signal 150. In this way, the resistor-capacitor network 235 generates the output clock signal 160 by delaying the input clock signal 150 by the RC time constant of the resistor-capacitor network 235.

In some embodiments, the variable delay circuit 155b includes an optional resistance control circuit 205. In these embodiments, the resistance control circuit 205 generates resistance control signals 220a-b based on the regulated signal 145 and provides the resistance control signals 220a-b to the resistor-capacitor network 235. The resistance control signals 220a-b control the resistance of the resistor-capacitor network 235. In various embodiments, the resistance control signals 220*a-b* may include an analog signal or a digital signal and may include more than one component signal. In some embodiments, the resistance control signals 220 include both analog and digital component signals. In embodiments without the resistance control circuit 205, the resistance control signals 220 are component signals of the regulated signal 145.

In some embodiments, the variable delay circuit 155*b* includes an optional capacitance control circuit 210. In these embodiments, the capacitance control circuit 210 generates capacitance control signals 225*a-b* based on the feedback signal 115 and provides the capacitance control signals 225*a-b* to the resistor-capacitor network 235. The capacitance control signals 225 control the capacitance of the resistor-capacitor network 235. In various embodiments, the capacitance control signals 225 may include an analog signal or a digital signal and may include more than one component signal. In some embodiments, the capacitance control signals 225*a-b* include both analog and digital component signals. In embodiments without the capacitance control circuit 210, the capacitance control signals 225 are component signals of the feedback signal 115.

Figure 3A:
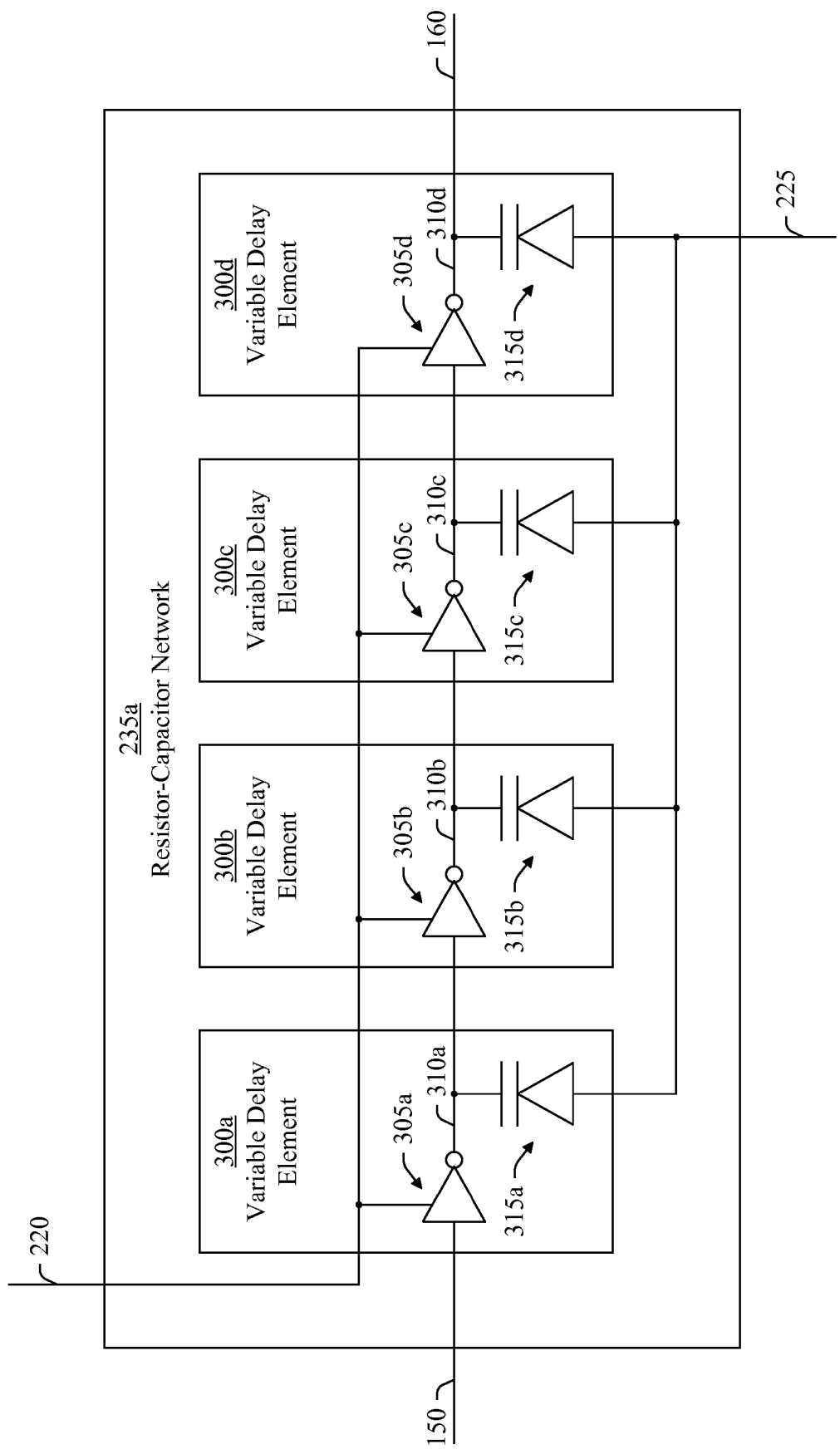
FIG. 3A is a block diagram of a resistor-capacitor network, in accordance with an embodiment of the present invention.

FIG. 3A illustrates the resistor-capacitor network 235*a*, in accordance with an embodiment of the present invention. The resistor-capacitor network 235*a* includes a chain of variable delay elements 300 (e.g., variable delay elements 300*a-d*). The variable delay element 300 includes a variable resistor circuit 305 (e.g., a variable resistor circuit 305*a-d*) and a variable capacitor circuit 315 (e.g., a variable capacitor circuit 315*a-d*). The variable resistor circuit 305 receives a clock signal at an input of the variable resistor circuit 305 and generates a clock signal at an output of the variable resistor circuit 305 by inverting the clock signal received at the input. Moreover, the resistance control signal 220 (e.g., regulated signal 145) controls a resistance of the variable resistance circuit 305. The output of resistance control circuit 305 in the variable delay element 300 is coupled (e.g., connected) to an output of the variable capacitor circuit 315 in the variable delay element 300.

The variable capacitor circuit 315 in the variable delay element 300 receives the inverted clock signal at the output of the variable capacitor circuit 315. Additionally, the variable capacitor circuit 315 receives the capacitance control signal 225 (e.g., the feedback signal 115) at an input of the variable capacitor circuit 315. The capacitance control signal 225 controls a capacitance of the variable capacitor circuit 315. For example, the variable capacitor circuit 315 may include a varactor having a capacitance controlled by the capacitance control signal received at an input of the varactor.

As illustrated in FIG. 3A, the variable resistor circuit 305*a* of the variable delay element 300*a* receives the input clock signal 150 at the input of the variable resistor circuit 305*a* and generates the clock signal 310*a*. The variable resistor circuit 305*b* of the variable delay element 300*b* receives the clock signal 310*a* at the input of the variable resistor circuit 305*b* and generates the clock signal 310*b*. The variable resistor circuit 305*c* of the variable delay element 300*c* receives the clock signal 310*b* at the input of the variable resistor circuit 305*c* and generates the clock signal 310*c*. The variable resistor circuit 305*d* of the variable delay element 300*d* receives the clock signal 310*c* at the input of the variable resistor circuit 305*d* and generates the output clock signal 160. Although the embodiment of the resistor-capacitor network 235 illustrated in FIG. 3A includes four variable delay elements 300, the resistor-capacitor network 235 may have any number of variable delay elements 300 in other embodiments.

Figure 3B:
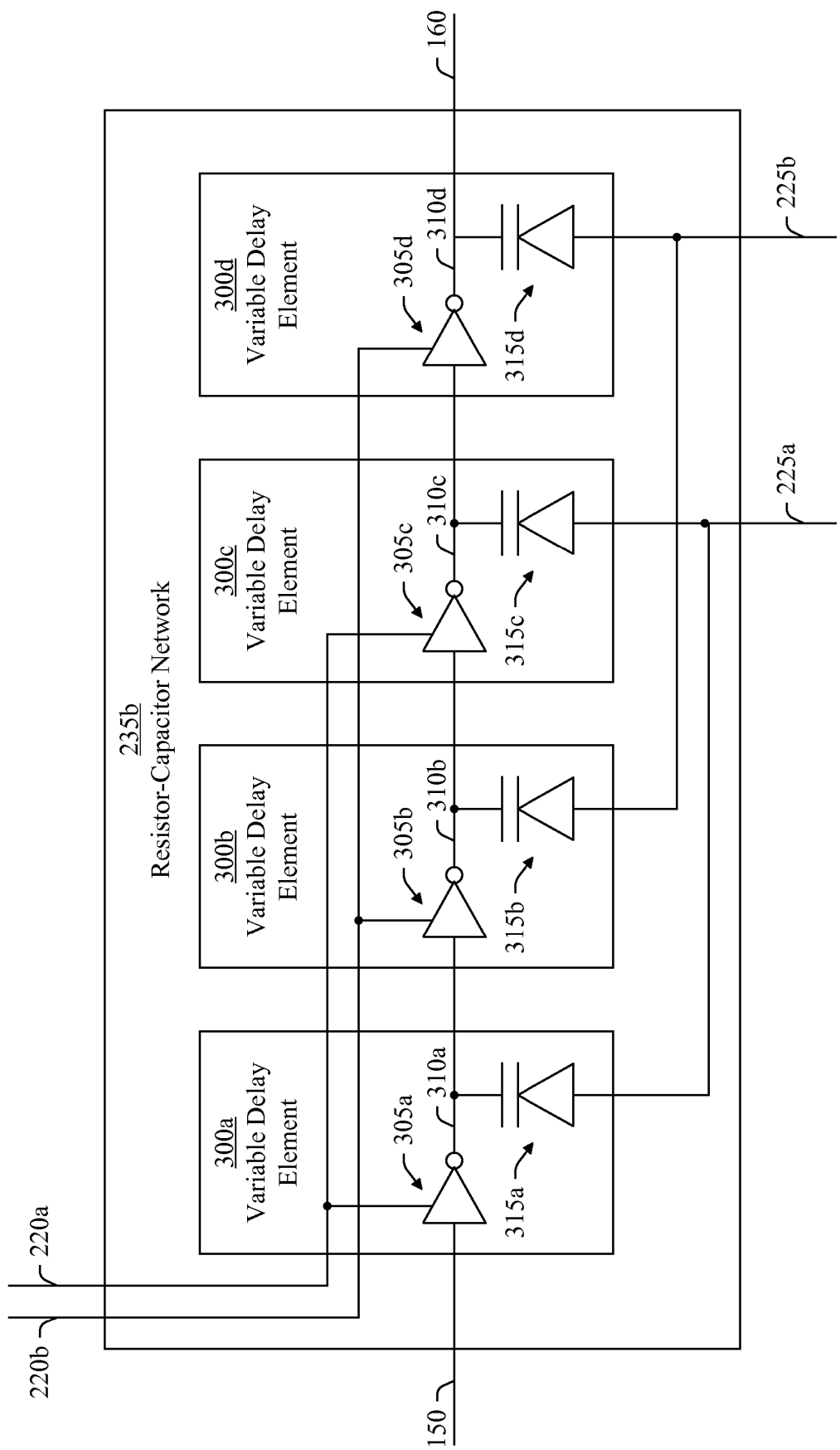
FIG. 3B is a block diagram of a resistor-capacitor network, in accordance with an embodiment of the present invention.

FIG. 3B illustrates the resistor-capacitor network 235*b*, in accordance with an embodiment of the present invention. In this embodiment, a resistance control signal 220*a* is coupled to and controls the resistance of the variable resistance circuits 305*a* and 305*c*, and a resistance control signal 220*b* is coupled to and controls the resistance of the variable resistance circuits 305*b* and 305*d*. In this way, each of the resistance control signals 220*a* and 220*b* controls alternate variable resistance circuits 305 in the chain of variable delay elements 300 and together the resistance control signals 220*a* and 220*b* control the variable resistance circuits 305 in the chain. Similarly numbered elements are described in FIG. 3A.

In the embodiment of FIG. 3B, a capacitance control signal 225*a* is coupled to and controls variable capacitor circuits 315*a* and 315*c*, and a capacitance control signal 225*b* is coupled to and controls capacitor circuits 315*b* and 315*d*. In this way, each of the capacitance control signals 225*a* and 225*b* controls alternate variable capacitor circuits 315 in the chain of variable delay elements 300 and together the capacitance control signals 225*a* and 225*b* control the variable capacitor circuits 315 in the chain.

Figure 9:
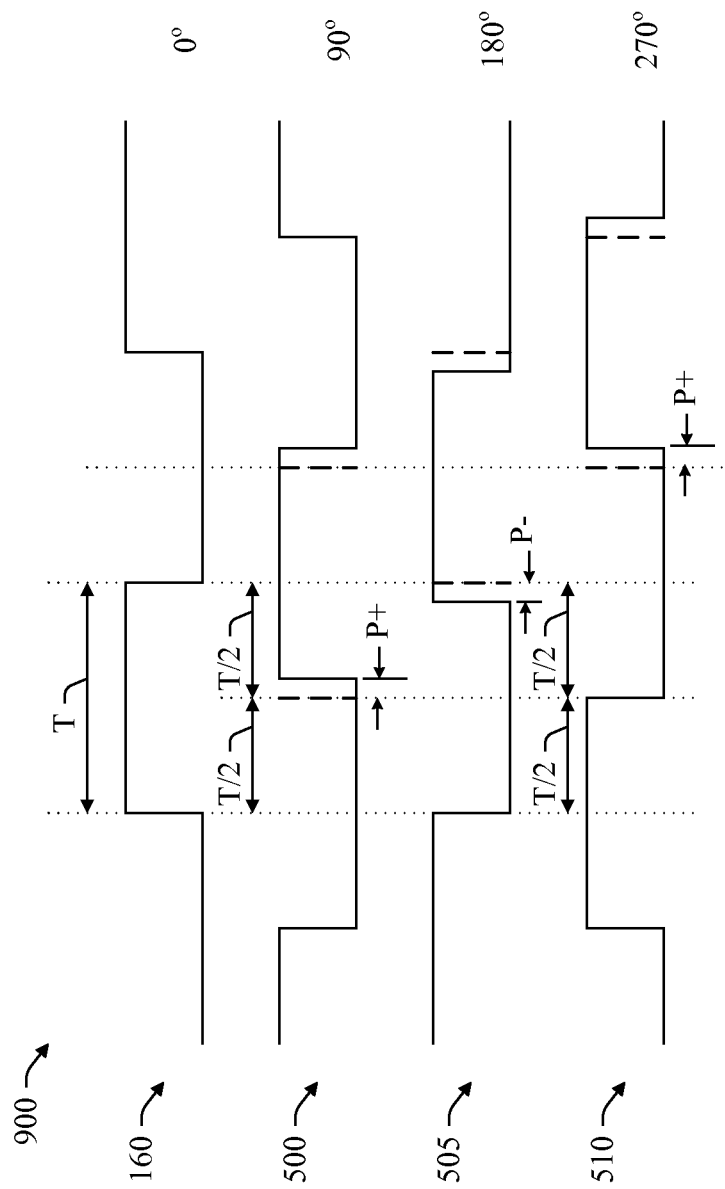
FIG. 9 is a timing diagram, in accordance with an embodiment of the present invention.

In this embodiment, the variable delay elements 300*b* and 300*d* act in tandem to generate a first angular phase change corresponding to a first phase time delay, and the variable delay elements 300*a* and 300*c* act in tandem to generate a second angular phase change corresponding to a second phase time delay. The first and second phase time delays have opposite signs such that a sum of the first and second phase time delays is zero, and the first and second angular phase changes are opposite in sign such that a sum of the first and second angular phase changes is zero. In this way, phase alignment is preserved at the 0 and 360 degree marks, as illustrated in FIG. 2B, FIG. 5B, and FIG. 9.

Figure 4:
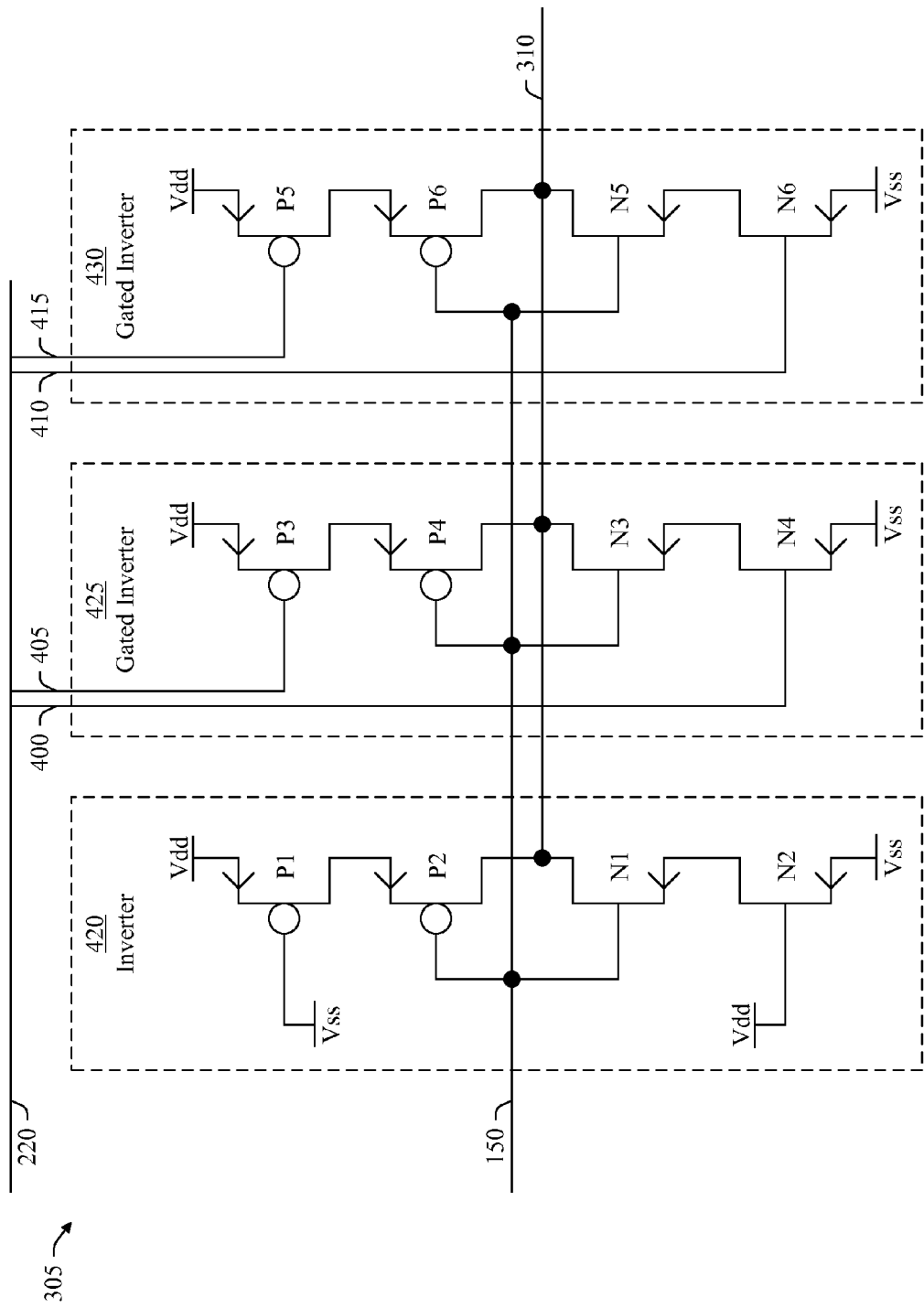
FIG. 4 is a block diagram of a variable resistor circuit, in accordance with an embodiment of the present invention.

FIG. 4 illustrates the variable resistor circuit 305, in accordance with an embodiment of the present invention. The variable resistor circuit 305 includes an inverter 420, a gated inverter 425, and a gated inverter 430. The inverter 420 includes P-type transistor P1 and P2 and N-type transistors N1 and N2. For example, the transistors P1, P2, N1, and N2 may be field effect transistors (FET) or metal-oxide-semiconductor (MOS) transistors. A source of the transistor P1 is connected to a supply voltage Vdd and a gate of the transistor P1 is connected to a ground potential Vss. A drain of the transistor P1 is connected to a source of the transistor P2. A gate of the transistor P2 receives the input clock signal 150. A drain of the transistor P2 is connected to a drain of the transistor N1. A gate of the transistor N1 receives the clock signal 150. A source of the transistor N1 is connected to a drain of the transistor N2. A gate of the transistor N2 is connected to the supply voltage Vdd. A source of the transistor N2 is connected to the ground potential Vss. The inverter 420 generates and outputs a component of the clock signal 310.

The gated inverter 425 includes P-type transistor P3 and P4 and N-type transistors N3 and N4. For example, the transistors P3, P4, N3, and N4 may be field effect transistors (FET) or metal-oxide-semiconductor (MOS) transistors. A source of the transistor P3 is connected to a supply voltage Vdd and a gate of the transistor P3 is connected to a control signal 405, which is a signal component of the resistance control signal 220. A drain of the transistor P3 is connected to a source of the transistor P4. A gate of the transistor P4 receives the input clock signal 150. A drain of the transistor P4 is connected to a drain of the transistor N3. A gate of the transistor N3 receives the clock signal 150. A source of the transistor N3 is connected to a drain of the transistor N4. A gate of the transistor N4 is connected to a control signal 400, which is a signal component of the resistance control signal 220. A source of the transistor N4 is connected to the ground potential Vss.

The gated inverter 425 generates and outputs a component of the clock signal 310 based on the control signals 400 and 405. Moreover, the control signal 400 controls the resistance between the source and drain of the transistor N4 and the control signal 405 controls the resistance between the source and the drain of the transistor P3. In this way, the control signals 400 and 405 control a resistance component in the variable resistor circuit 305. For example, the control signals 400 and 405 may be digital signals for turning on or turning off the respective corresponding transistors N4 and P3. In another example, the control signals 400 and 405 may be analog signals for biasing the respective corresponding transistors N4 and P3 (i.e., partially turning on the transistors N4 and P3).

The gated inverter 430 includes P-type transistor P5 and P6 and N-type transistors N5 and N6. For example, the transistors P5, P6, N5, and N6 may be field effect transistors (FET) or metal-oxide-semiconductor (MOS) transistors. A source of the transistor P5 is connected to a supply voltage Vdd and a gate of the transistor P5 is connected to a control signal 415, which is a signal component of the resistance control signal 220. A drain of the transistor P5 is connected to a source of the transistor P6. A gate of the transistor P6 receives the input clock signal 150. A drain of the transistor P6 is connected to a drain of the transistor N5. A gate of the transistor N5 receives the clock signal 150. A source of the transistor N5 is connected to a drain of the transistor N6. A gate of the transistor N6 is connected to a control signal 410, which is a signal component of the resistance control signal 220. A source of the transistor N6 is connected to the ground potential Vss.

The gated inverter 430 generates and outputs a component of the clock signal 310 based on the control signals 410 and 415. Moreover, the control signal 410 controls the resistance between the source and drain of the transistor N6 and the control signal 415 controls the resistance between the source and the drain of the transistor P5. In this way, the control signals 410 and 415 control a resistance component in the variable resistor circuit 305. For example, the control signals 410 and 415 may be digital signals for turning on or turning off the respective corresponding transistors N6 and P5. In another example, the control signals 410 and 415 may be analog signals for biasing the respective corresponding transistors N6 and P5 (i.e., partially turning on the transistors N6 and P5).

Although the embodiment of the variable resistor circuit 305 illustrated in FIG. 4 includes one inverter 420 and two gated inverters 425 and 430, the variable resistor circuit 305 may have any number of inverters 420 and any number of gated inverters (e.g., gated inverters 425 or 430) in other embodiments. Moreover the sizes of the transistors may differ among the inverters 420 and the gate inverters (e.g., gated inverters 425 or 430) in the variable resistor circuit 305.

Figure 5A:
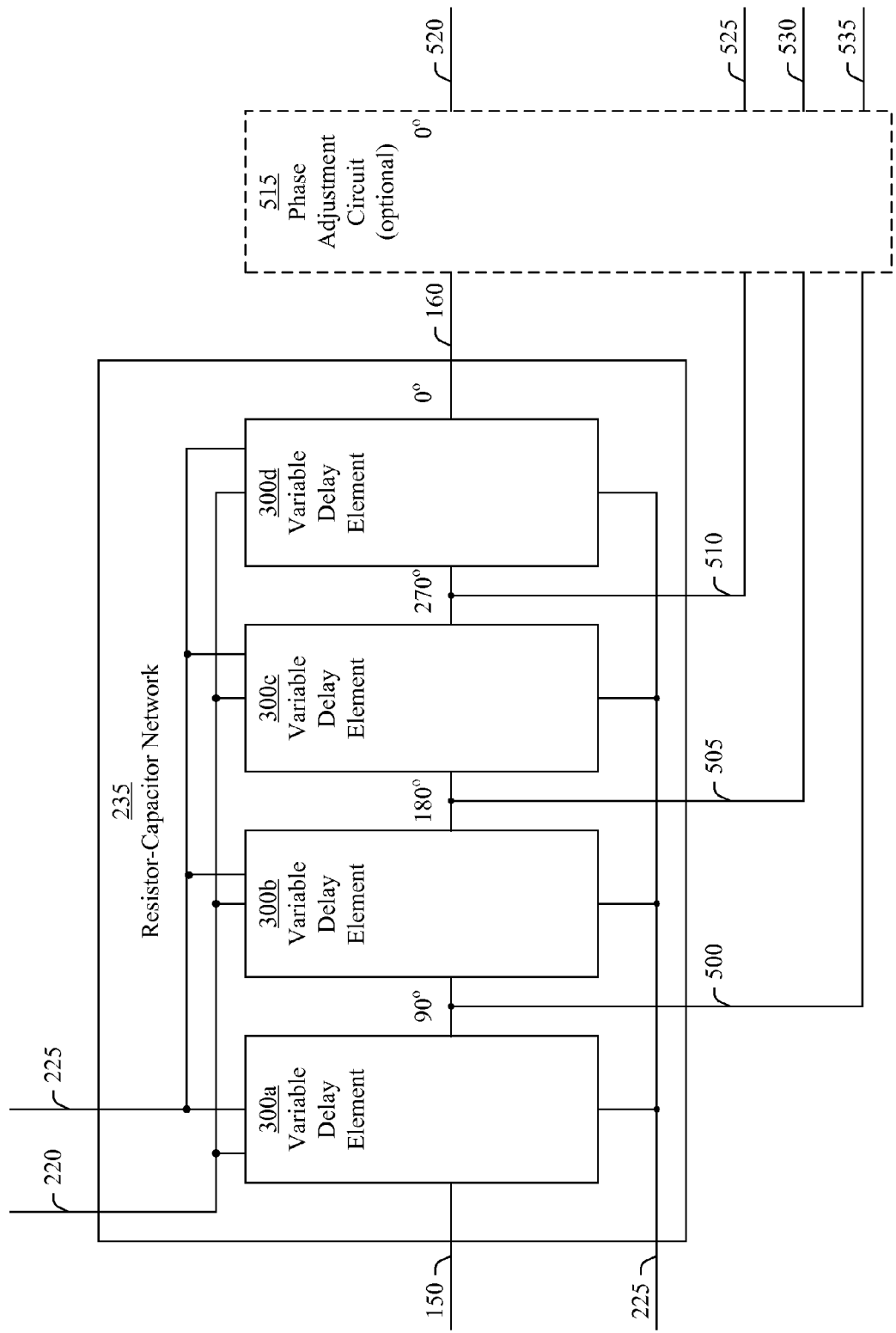
FIG. 5A is a block diagram of a resistor-capacitor network, in accordance with an embodiment of the present invention.
Figure 5B:
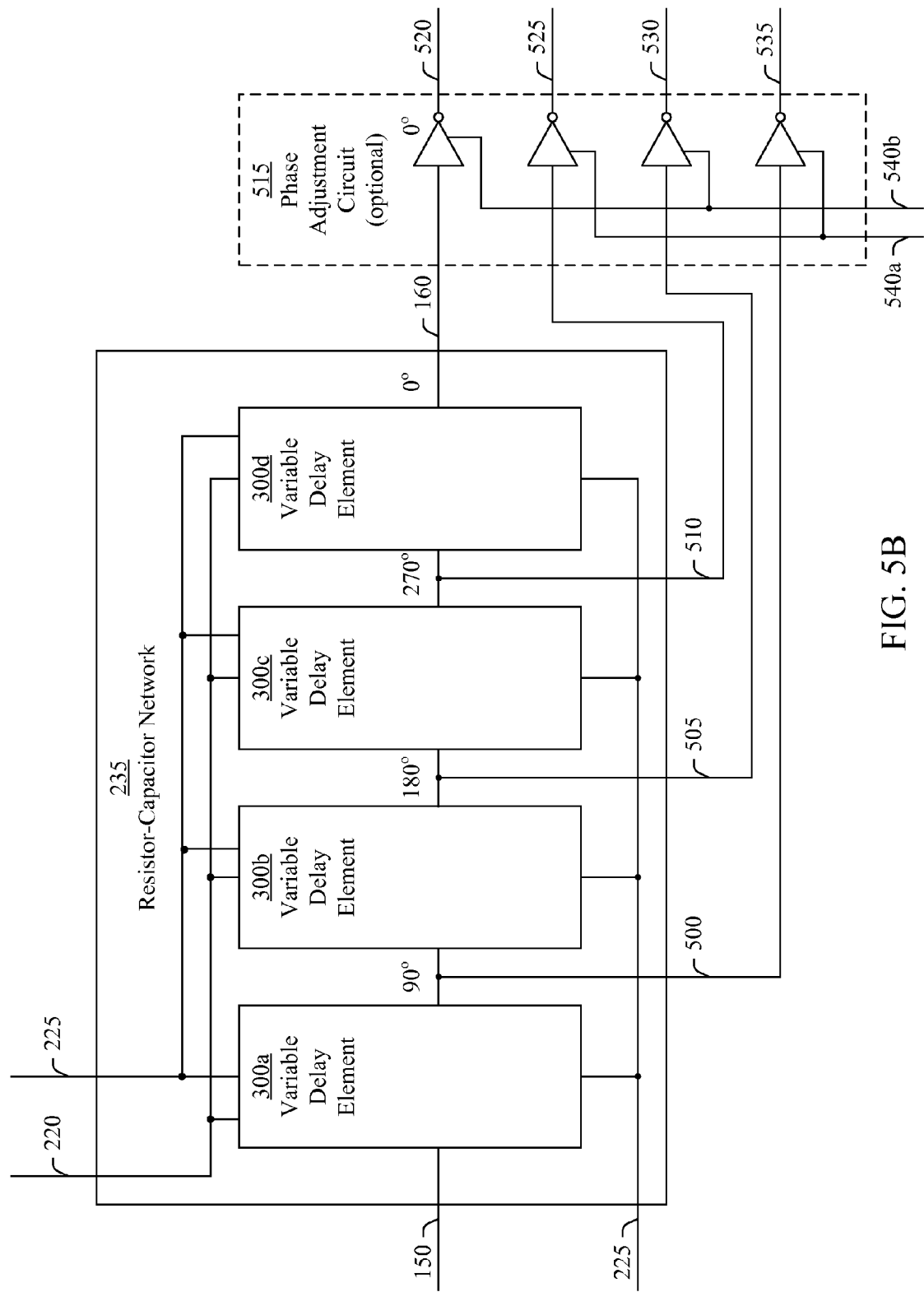
FIG. 5B is a block diagram of a resistor-capacitor network, in accordance with an embodiment of the present invention.

FIG. 5A illustrates a resistor-capacitor network 235, in accordance with an embodiment of the present invention. The resistor-capacitor network 235 includes four variable delay elements 300 (i.e., variable delay elements 300a-d). As illustrated in FIG. 5A, the variable delay element 300a generates a clock signal 500 having a ninety-degree phase offset from the input clock signal 150. The variable delay element 300b generates a clock signal 505 having a one-hundred eighty degree phase offset from the input clock signal 150. The variable delay element 300c generates a clock signal 510 having a two-hundred seventy degree phase offset from the input clock signal 150. The variable delay element 300d generates the output clock signal 160 having a zero degree phase offset from the input clock signal 150.

In this embodiment, the clock signal 500 and the clock signal 510 form a clock signal pair in which the clock signals 500 and 510 are component signals of the clock signal pair. The clock signal 505 and the output clock signal 160 form another clock signal pair in which the clock signals 505 and 160 are component signals of the clock signal pair. For example, the clock signal pair including the clock signal 500 and the clock signal 510 may be in-phase clock signals and the clock signal 505 and the output clock signal 160 may be quadrature clock signals. In other embodiments, the resistor capacitor network 235 may generate more or fewer than four clock signals having different offsets from the input clock signal 150. For example, the resistor capacitor network 235 may generate eight clock signals each having a different phase offset from the input clock signal 150 that is a multiple of forty-five degrees. As another example, the resistor capacitor network 235 may generate sixteen clock signals each having a different phase offset from the input clock signal 150 that is a multiple of twenty-two and a half degrees.

In various embodiments, the variable delay circuit 155 using resistor-capacitor network 235 will also include an optional phase adjustment circuit 515. The phase adjustment circuit 515 adjusts a phase offset between two clock signal pairs while maintaining the phase offset between the component signals in each of the clock signal pairs. For example, the phase adjustment circuit 515 may pass the clock signal pair including the clock signals 505 and 160 by passing the clock signal 160 as a clock signal 520 and passing the clock signal 505 as a clock signal 530. In this example, the phase adjustment circuit 515 adjusts the phase offset between the clock signal pair including the clock signals 505 and 160 and the clock signal pair including the clock signals 500 and 510 shifting the phases of the clock signals 500 and 510 by substantially the same amount relative to the phase of the input clock signal 150. In this way, the phase adjustment circuit 515 adjusts a phase offset between the two clock signal pairs while maintaining the phase offset between the component signals in each of the clock signal pairs.

FIG. 5B illustrates the resistor-capacitor network 235, in accordance with an embodiment of the present invention. The resistor-capacitor network 235 is controlled by resistance control signal 220 and capacitance control signal 225, and is cascaded with the phase adjustment circuit 515 having separate phase offsets controls 540a and 540b for controlling the phase offsets of the clock signals 520, 525, 530, and 535 generated by the phase adjustment circuit 515. In another embodiment, the resistor-capacitor network 235 is controlled by resistance control signals 220a and 220b, and capacitance control signals 225a and 225b. In each of these embodiments, the resistor-capacitor network 235 includes four modes of cascaded phase operation.

In a first mode of cascaded phase operation, the resistor-capacitor network 235 generates clock signal 500, 505, 510, and 160 having constant phase offsets and the phase adjustment circuit 515 generates the clock signals 520, 525, 530, and 535 having constant phase offsets. In a second mode of cascaded phase operation, the resistor-capacitor network 235 generates clock signal 500, 505, 510, and 160 having variable phase offsets and the phase adjustment circuit 515 generates the clock signals 520, 525, 530, and 535 having constant phase offsets. In a third mode of cascaded phase operation, the resistor-capacitor network 235 generates clock signal 500, 505, 510, and 160 having constant phase offsets and the phase adjustment circuit 515 generates the clock signals 520, 525, 530, and 535 having variable phase offsets. In a fourth mode of cascaded phase operation, the resistor-capacitor network 235 generates clock signal 500, 505, 510, and 160 having variable phase offsets and the phase adjustment circuit 515 generates the clock signals 520, 525, 530, and 535 having variable phase offsets.

Figure 6A:
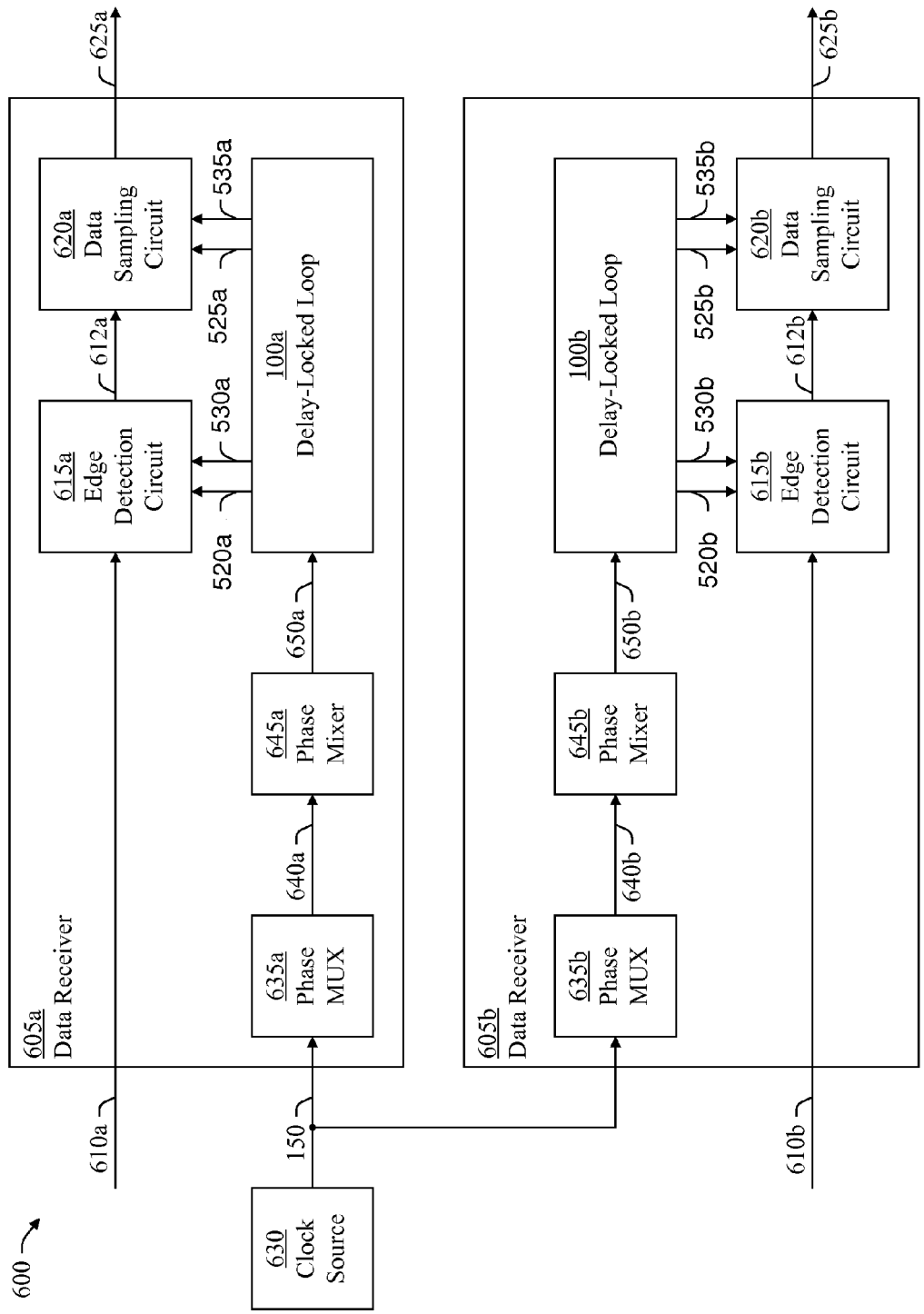
FIG. 6A is a block diagram of a receiver system, in accordance with an embodiment of the present invention.

FIG. 6A illustrates a receiver system 600, in accordance with an embodiment of the present invention. The receiver system 600 includes a clock source 630 and data receivers 605 (e.g., data receivers 605a and 605b). The clock source 630 generates a clock signal 150 including component clock signals having phase offsets with respect to each other and provides the clock signal 150 to each of the data receivers 600. In addition to receiving the clock signal 150, each of the data receivers 605 receives a corresponding input data stream 610 (e.g., input data streams 610a-b) and generates a corresponding output data stream 625 (e.g., output data streams 625a-b) based on the corresponding input data stream.

In addition to a delay-locked loop 100 (e.g., delay locked loop 100a-b), each of the data receivers 605 includes an edge detection circuit 615 (e.g., edge detection circuit 615a-b), a data sampling circuit 620 (e.g., data sampling circuit 620a-b), a phase multiplexer (Phase MUX) 635 (e.g., phase multiplexers 635a-b), and a phase mixer 645 (e.g., phase mixers 645a-b). The phase mixer 645 in the data receiver 605 is coupled (e.g., connected) to the phase multiplexer 635 and the delay-locked loop 100 of the data receiver 605. Additionally, the delay-locked loop 100 of the data receiver 605 is coupled (e.g., connected) to the edge detection circuit 615 and the data sampling circuit 620 of the data receiver 605. As illustrated in FIG. 6A, the data receiver 605a includes the delay-locked loop 100a, the edge detection circuit 615a, the data sampling circuit 620a, the phase multiplexer 635a, and the phase mixer 645a. The data receiver 605b includes the delay-locked loop 100b, edge detection circuit 615b, the data sampling circuit 620b, the phase multiplexer 635b, and the phase mixer 645b.

In the data receiver 605, the phase multiplexer 635 receives the clock signal 150 and selects two or more component clock signals 640 of the clock signal 150, for example based on a user input. The phase multiplexer 635 passes the selected component clock signals 640 to the phase mixer 645. In turn, the phase mixer 645 generates a single phase clock signal 650 by mixing the selected component clock signals 640 received from the phase multiplexer 635. For example, the phase mixer 645 may generate the single phase clock signal 650 by individually weighting each of the selected component clock signals 640 based on user input and combining the weighted component clock signals.

The delay-locked loop 100 generates a first clock signal pair including the clock signals 520 and 530 (e.g., clock signals 520a-b and 530a-b) and provides the clock signal pair to the edge detection circuit 615. In turn, the edge detection circuit 615 detects data edge transitions in the input date stream based on the clock signal pair including the clock signal signals 520 and 530 and generates a recovered clock signal 612 (e.g., recovered clock signal 612a-b) based on the clock signals 520 and 530. Additionally, the delay-locked loop 100 generates a second clock signal pair including the clock signals 525 and 535 (e.g., clock signals 525a-b and 535a-b) and provides the clock signal pair to the data sampling circuit 620. In turn, the data sampling circuit 620 samples data bits in the input data stream based on the recovered clock signal 612 and on the clock signal pair including the clock signals 525 and 535.

In some embodiments, the clock signals 525 and 535 in the clock signal pair received at the data sampling circuit 620 are delayed by circuitry in the data sampling circuit 620 so that the phases of the clock signals 525 and 535 in the clock signal pair are shifted with respect to the phases of the recovery clock signal 612. For example, the clock signals 525 and 535 in the clock signal pair may be delayed through a decision feedback equalizer (DFE) in the data sampling circuit 620. As a result, the data sampling circuit 620 does not sample data bits near a midpoint between clock edge transitions of the recovered clock signal 612. In some of these embodiments, the phase adjustment circuit 515 in the variable delay circuit 155 of the delay-locked loop 100 in the data receiver 605 adjusts the phase offset between the clock signal pair including the clock signal pair of clock signals 520 and 530 and the clock signal pair of clock signals 525 and 535 while maintaining the phase offset between the clock signals 520 and 530 within the first clock signal pair, and maintaining the phase offset between the clock signals 525 and 535 within the second clock signal pair. As a result, of the adjustment to the phase offset between the two clock signal pairs, the data sampling circuit 620 samples data bits in the input data stream 610 at substantially the midpoints of the data bits between clock edge transitions of the input data stream 610 received at the data receiver 600.

Figure 6B:
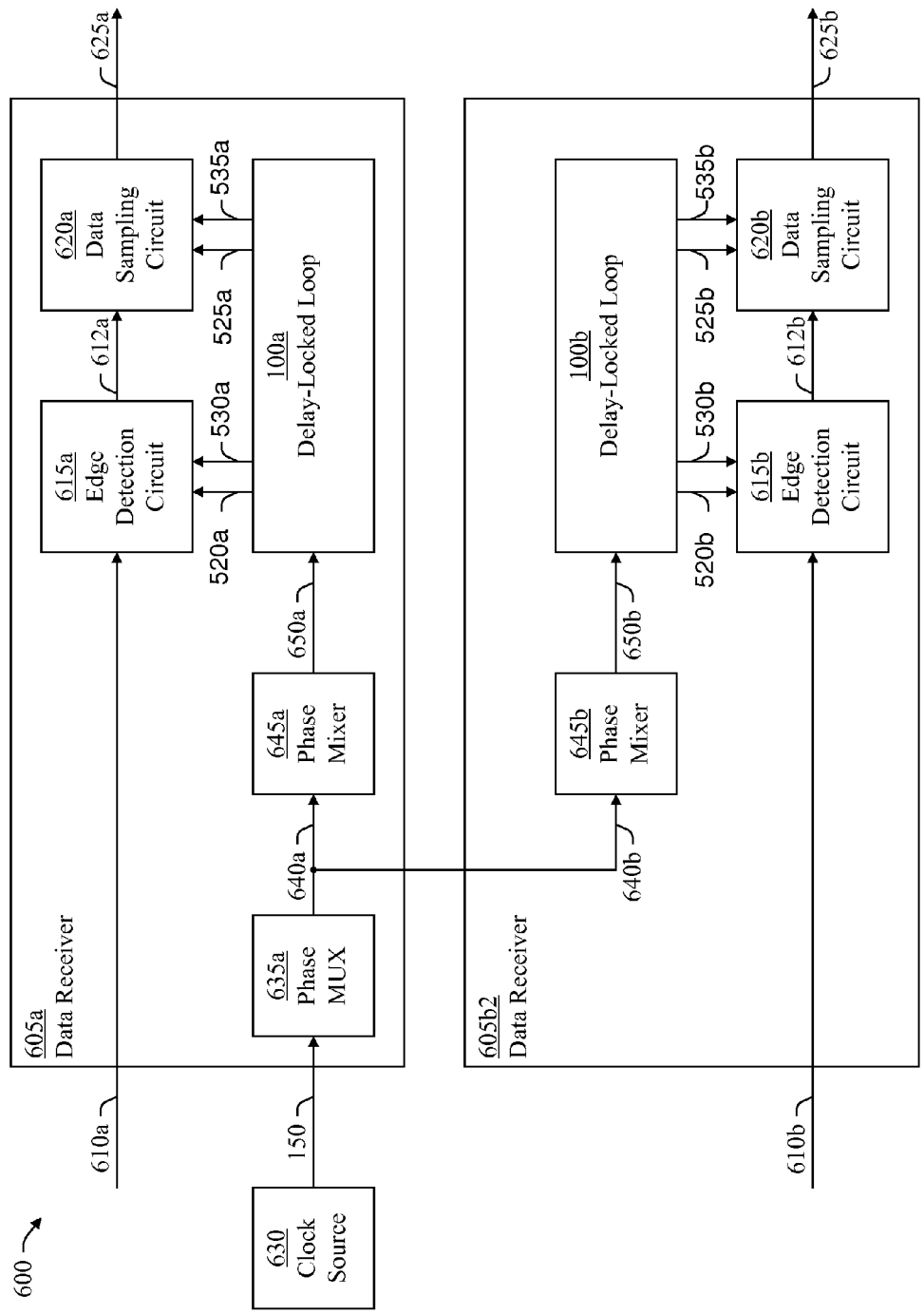
FIG. 6B is a block diagram of a receiver system, in accordance with an embodiment of the present invention.

FIG. 6B illustrates an embodiment of receiver system 600, in accordance with an embodiment of the present invention. In this embodiment, the data receiver 605b2 does not include the phase multiplexer 635b but instead uses the selected component clock signals 640a generated by the phase multiplexer 635a of the data receiver 605a, which reduces power consumption in the receiver system 600. As illustrated in FIG. 6B, the phase mixer 645b of the data receiver 605b2 receives the selected component clock signals 640a generated by the phase multiplexer 635a of the data receiver 605a. Although each of the phase mixers 645a and 645b of the corresponding data receivers 605a and 605b2 receive the same selected component clock signals 640a, each of the phase mixers 645a and 645b independently select phase offsets for mixing the selected component clock signals 640a to generate the corresponding single phase clock signals 650a and 650b. In this way, the phase mixers 645a and 645b generate the single phase clock signals 650a and 650b independently on a per channel basis.

Figure 7:
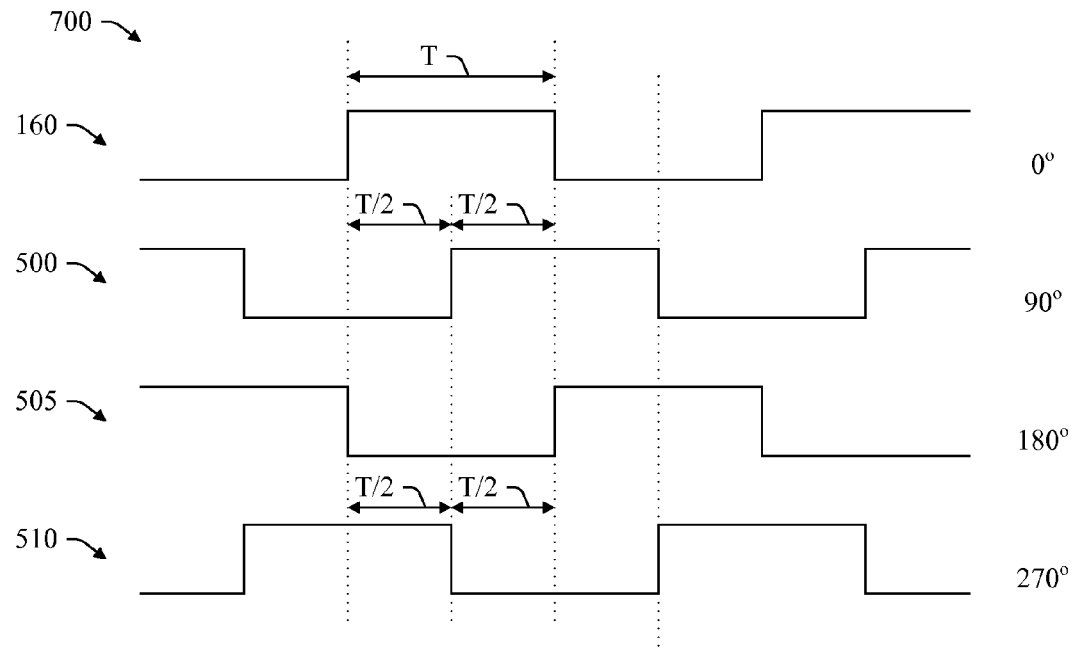
FIG. 7 is a timing diagram, in accordance with an embodiment of the present invention.

FIG. 7 illustrates a timing diagram 700, in accordance with an embodiment of the present invention. The timing diagram 700 shows exemplary waveforms for the output clock signal 160 and the clock signals 500, 505, and 510. As may be envisioned from FIG. 7, the output clock signal 160 has a zero degree phase offset from the input clock signal 150. The clock signal 500 has a ninety degree phase offset from the input clock signal 150. The clock signal 510 has a one-hundred eighty degree phase offset from the input clock signal 150. The clock signal 520 has a two-hundred seventy degree phase offset from the input clock signal 150.

As is also illustrated in FIG. 7, the period between successive clock edge transitions of each of the clock signals is T time units. Moreover, clock edge transitions of the clock signals 500 and 510 occur substantially at a midpoint between successive clock edge transitions of the clock signals 160 and 510 at a period of T/2 time units from each clock edge transition of the successive clock edge transitions of the output clock signal 160 and the clock signal 505.

Figure 8:
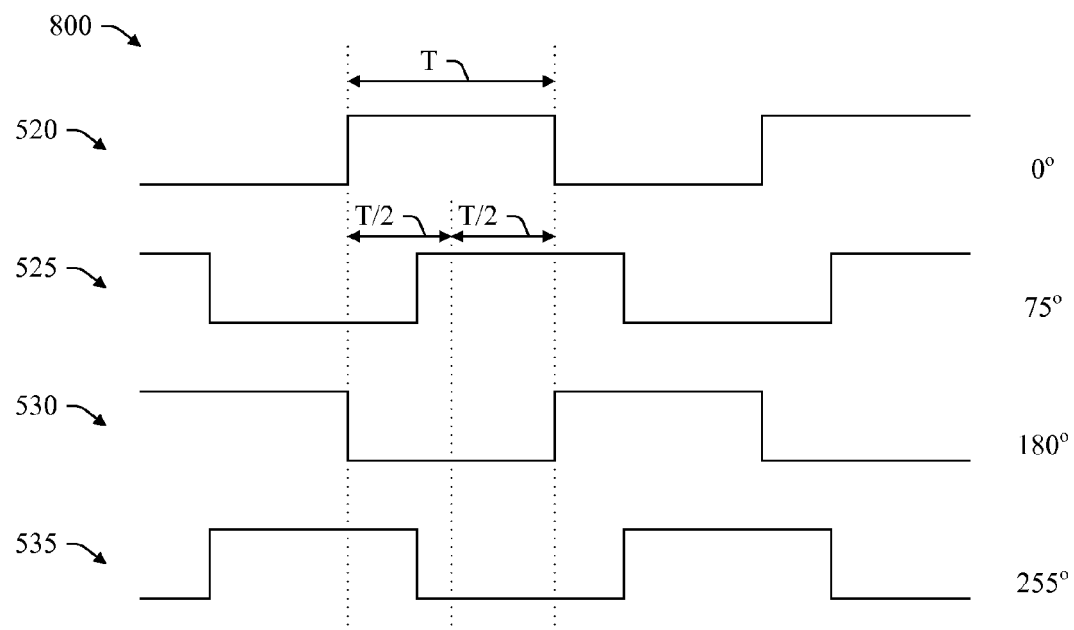
FIG. 8 is a timing diagram, in accordance with an embodiment of the present invention.

FIG. 8 illustrates a timing diagram 800, in accordance with an embodiment of the present invention. The timing diagram 800 shows exemplary waveforms for the clock signals 520, 525, 530, and 535 generated by the phase adjustment circuit 515 based on the output clock signal 160 and the clock signals 500, 505, and 510. As may be envisioned from FIG. 8, the clock signal 520 has a zero degree phase offset from the input clock signal 150. The clock signal 525 has a seventy-five degree phase offset from the input clock signal 150. The clock signal 530 has a one-hundred eighty degree phase offset from the input clock signal 150. The clock signal 535 has a two-hundred fifty-five degree phase offset from the input clock signal 150.

As is also illustrated in FIG. 8, the period between successive clock edge transitions of each of the clock signals is T time units. Moreover, clock edge transitions of the clock signals 525 and 535 do not occur substantially at a midpoint between successive clock edge transitions of the clock signals 520 and 530 because clock edge transitions of the clock signals 525 and 535 are less than a period of T/2 time units from one clock edge transition of the successive clock edge transitions of the clock signal 520 and 530 and are more than T/2 time units from the clock edge transition of the other clock edge transition of the successive clock edge transitions of the clock signals 520 and 530.

FIG. 9 illustrates a timing diagram 900, in accordance with an embodiment of the present invention. The timing diagram 900 shows exemplary waveforms for the output clock signal 160 and the clock signals 500, 505, and 510. As may be envisioned from FIG. 9, the output clock signal 160 has a zero degree phase offset from the input clock signal 150. The clock signal 500 has a ninety degree phase offset from the input clock signal 150. The clock signal 505 has a one-hundred eighty degree phase offset from the input clock signal 150. The clock signal 510 has a two-hundred seventy degree phase offset from the input clock signal 150.

As is also illustrated in FIG. 9, the period between successive clock edge transitions of each of the clock signals is T time units. Moreover, clock edge transitions of the clock signals 500 and 510 occur substantially at a midpoint between successive clock edge transitions of the clock signals 160 and 510 at a period of T/2 time units from each clock edge transition of the successive clock edge transitions of the output clock signal 160 and the clock signal 505. In contrast to the clock signals 500, 505, and 510 illustrated in FIG. 7, some of the clock edges of the clock signals 500, 505, and 510 of FIG. 9 have phase changes (e.g., positive phase changes and negative phase changes) corresponding to phase time delays (e.g., positive phase time delays P+ and negative phase time delays P−). As a result of the phase changes, the clock signals 500, 505, and 510 of FIG. 9 have asymmetric waveforms.

Figure 10:
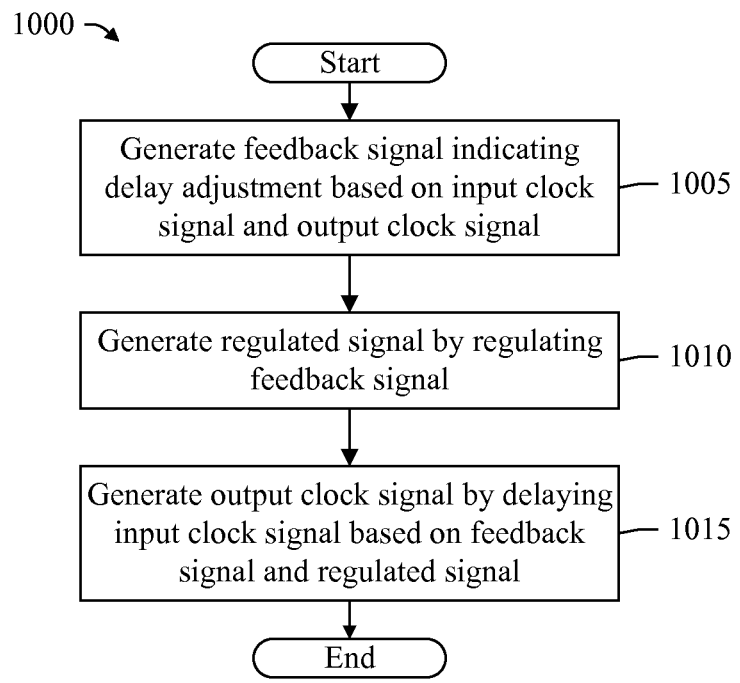
FIG. 10 is a flow chart for a method of generating an output clock signal in a delay-locked loop, in accordance with an embodiment of the present invention.

FIG. 10 illustrates a method 1000 of generating an output clock signal in a delay-locked loop, in accordance with an embodiment of the present invention. In step 1005, a feedback signal 115 is generated indicating a delay adjustment for a variable delay circuit 155 based on an input clock signal 150 and an output clock signal. In various embodiments, the feedback circuit 105 generates the feedback signal 115. The method 1000 then proceeds to step 1010.

In step 1010, a regulated signal 145 is generated by regulating a power supply using the feedback signal 115 as a reference. In various embodiments, the power regulator 110 generates the feedback signal 115. The method 1000 then proceeds to step 1015.

In step 1015, the output clock signal 160 is generated by delaying the input clock signal 150 based on the feedback signal 115 and the regulated signal 145. In various embodiments, the variable delay circuit 155 generates the output clock signal 160. The method 1000 then ends.

In various embodiments, the method 1000 illustrated in FIG. 10 may include more or fewer than the steps 1005-1015 illustrated in FIG. 10 and described above. In some embodiments, the steps 1005-1015 of the method 1000 may be performed in a different order than the order illustrated in FIG. 10 and described above. In some embodiments, some of the steps 1005-1015 of the method 1000 may be performed in parallel or substantially simultaneously. In various embodiments, one or more of the steps 1005-1015 may be performed more than once in the method 1000.

Figure 11:
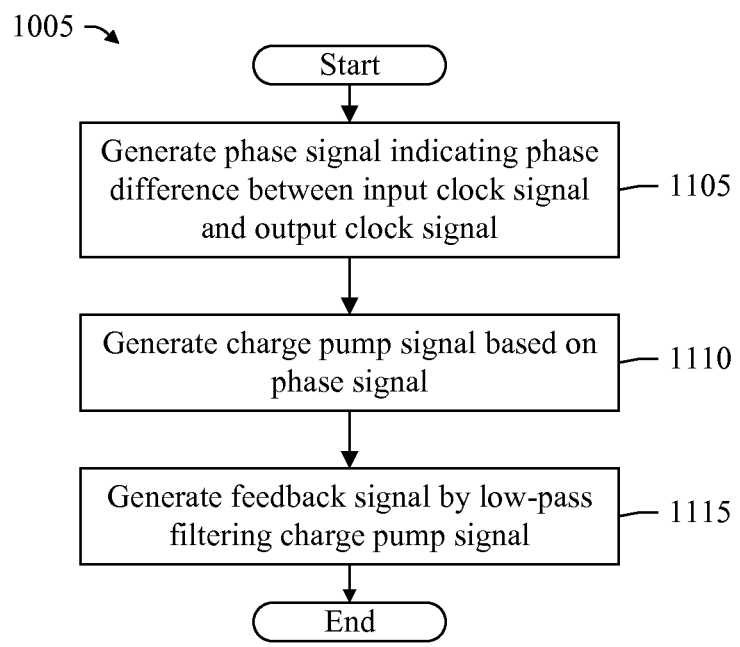
FIG. 11 is a flow chart for a portion of a method of generating an output clock signal in a delay-locked loop, in accordance with an embodiment of the present invention.

FIG. 11 illustrates a portion of a method of generating an output clock signal in a delay-locked loop, in accordance with an embodiment of the present invention. In this embodiment, the portion of the method illustrated in FIG. 11 includes embodiments of step 1005 of the method 1000 illustrated in FIG. 10. In step 1105, a phase signal 135 indicating a phase difference between the input clock signal 150 and the output clock signal 160 is generated. In various embodiments, the phase detector 140 generates the phase signal 135. The portion of the method 1000 then proceeds to step 1110.

In step 1110, a charge pump signal 125 is generated based on the phase signal 135. In various embodiments, the charge pump 130 generates the charge pump signal 125. The portion of the method 1000 then proceeds to step 1115.

In step 1115, the feedback signal 115 is generated by low-pass filtering the charge pump signal 125. In various embodiments, the loop filter 120 generates the feedback signal 115. The portion of the method 1000 then ends.

In various embodiments, the portion method 1000 illustrated in FIG. 11 may include more or fewer than the steps 1105-1115 illustrated in FIG. 11 and described above. In some embodiments, the steps 1105-1115 of the method 1000 may be performed in a different order than the order illustrated in FIG. 11 and described above. In some embodiments, some of the steps 1105-1115 of the method 1000 may be performed in parallel or substantially simultaneously. In various embodiments, one or more of the steps 1105-1115 may be performed more than once in the method 1000.

Figure 12:
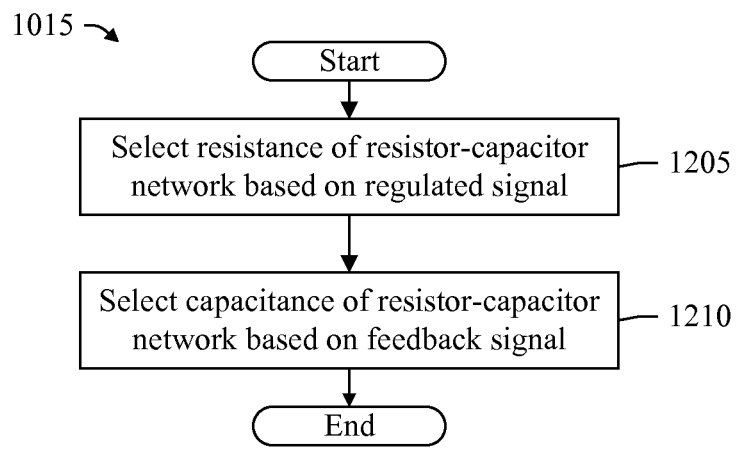
FIG. 12 is a flow chart for a portion of a method of generating an output clock signal in a delay-locked loop, in accordance with an embodiment of the present invention.

FIG. 12 illustrates a portion of a method of generating an output clock signal in a delay-locked loop, in accordance with an embodiment of the present invention. In this embodiment, the portion of the method illustrated in FIG. 12 includes embodiments of step 1015 of the method 1000 illustrated in FIG. 10. In step 1205, a resistance of a resistor-capacitor network 235 is selected based on the regulated signal 145. In various embodiments, the variable delay circuit 155 selects the resistance of the resistor-capacitor network 235 based on the regulated signal 145. In this way, the variable delay circuit 155 controls the resistance of the resistor-capacitor network 235 based on the regulated signal 145. The portion of the method 1000 then proceeds to step 1210.

In step 1210, a capacitance of a resistor-capacitor network 235 is selected based on the feedback signal 115. In various embodiments, the variable delay circuit 155 selects the capacitance of the resistor-capacitor network 235 based on the feedback signal 115. In this way, the variable delay circuit 155 controls the capacitance of the resistor-capacitor network 235 based on the feedback signal 115. The portion of the method 1000 then ends.

In various embodiments, the portion method 1000 illustrated in FIG. 12 may include more or fewer than the steps 1205-1210 illustrated in FIG. 12 and described above. In some embodiments, the steps 1205-1210 of the method 1000 may be performed in a different order than the order illustrated in FIG. 12 and described above. In some embodiments, some of the steps 1205-1210 of the method 1000 may be performed in parallel or substantially simultaneously. In various embodiments, one or more of the steps 1205-1100 may be performed more than once in the method 1000.

Figure 13:
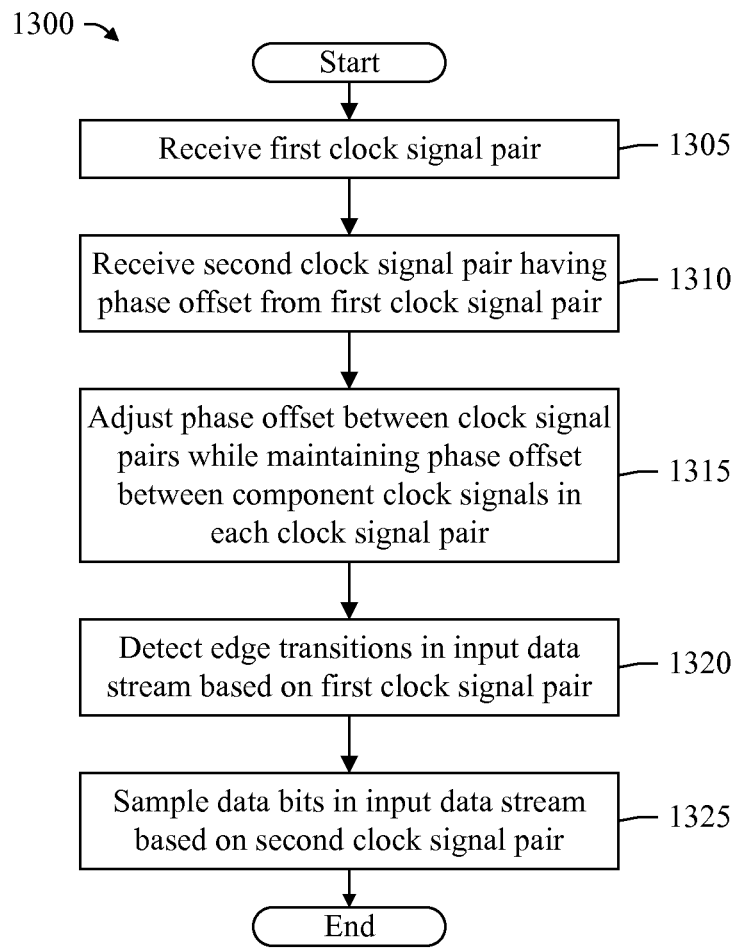
FIG. 13 is a flow chart for a portion of a method of generating an output clock signal in a delay-locked loop, in accordance with an embodiment of the present invention.

FIG. 13 illustrates a portion of a method of generating an output clock signal in a delay-locked loop, in accordance with an embodiment of the present invention. In this embodiment, the portion of the method illustrated in FIG. 13 may be performed after step 1015 of the method 1000 illustrated in FIG. 10. In step 1305, a first clock signal pair is received. In various embodiments, the delay-locked loop 100 generates the first clock signal pair including the clock signal 505 and the output clock signal 160 and provides the first clock signal pair to the phase adjustment circuit 515, and the phase adjustment circuit 515 provides the first clock signal pair to the edge detection circuit 615 as the clock signals 520 and 530. In turn, the edge detection circuit 615 receives the first clock signal pair from the phase adjustment circuit 515. In other embodiments, the delay-locked loop 100 provides the first clock signal pair to the edge detection circuit 615, and the edge detection circuit 615 receives the first clock signal pair from the phase adjustment circuit 515. The portion of the method 1000 then proceeds to step 1310.

In step 1310, a second clock signal pair having a phase offset from the first clock signal pair is received. In various embodiments, the delay-locked loop 100 generates clock signals 500 and 510 and provides the clock signals 500 and 510 to the phase adjustment circuit 515. The phase adjustment circuit 515 generates the second clock signal pair including clock signal 525 and 535, and provides the second clock signal pair to the data sampling circuit 620. In turn, the data sampling circuit 620 receives the second clock signal pair from the phase adjustment circuit 515.

In another embodiment, the delay-locked loop 100 generates the first clock signal pair based on the clock signals 500 and 510, and generates the second clock signal pair based on the output clock signal 160 and the clock signal 505. The portion of the method 1000 then proceeds to step 1315.

In step 1315, a phase offset between the first clock signal pair and the second clock signal pair is adjusted while maintaining the phase offset between the component clock signals in each of the clock signal pairs. In various embodiments, the phase adjustment circuit 515 adjusts the phase offset between the first clock signal pair and the second clock signal pair but maintains the phase offset between the component clock signals in the first clock signal pair and between the component clock signals in the second clock signal pair. The portion of the method 1000 then proceeds to step 1320.

In step 1320, edge transitions are detected in an input data stream based on the first clock signal pair. In various embodiments, the edge detection circuit 610 detects data edge transitions in the input data stream based on the first clock signal pair. The portion of the method 1000 then proceeds to step 1325.

In step 1325, data bits in the input data stream are sampled based on the second clock signal pair. In various embodiments, the data sampling circuit 615 samples data bits in the input data stream based on the second clock signal pair. The portion of the method 1000 then ends.

In various embodiments, the portion method 1000 illustrated in FIG. 13 may include more or fewer than the steps 1305-1325 illustrated in FIG. 13 and described above. In some embodiments, the steps 1305-1325 of the method 1000 may be performed in a different order than the order illustrated in FIG. 13 and described above. In some embodiments, some of the steps 1305-1325 of the method 1000 may be performed in parallel or substantially simultaneously. In various embodiments, one or more of the steps 1305-1325 may be performed more than once in the method 1000.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A delay-locked loop (DLL) circuit comprising:
    a variable delay circuit having a plurality of delayed clock output pairs, wherein each of the delayed clock output pairs comprises a first signal and a second signal having a phase offset from each other; and
    a phase adjustment circuit coupled to the variable delay circuit, wherein each of the delayed clock output pairs is phase adjusted separately with respect to each other.

2. The DLL of claim 1 wherein:
    the first signal and the second signal of each of the plurality of delayed clock output pairs have a phase offset that is constant.

3. The DLL of claim 2 wherein:
    the phase offset between the first signal and the second signal of each of the delayed clock output pairs is approximately 180 degrees.

4. The DLL of claim 1 wherein:
    the phase adjustment circuit comprises:
        a plurality of phase offset controls; and wherein:
            each of the phase offset controls is coupled to a separate one of the delayed clock output pairs.

5. The DLL of claim 4 wherein:
    each of the phase offset controls is controlled independently in order to adjust a phase of a first delayed clock output pair with respect to a second delayed clock output pair.

6. The DLL of claim 4 further comprising:
    a first delayed clock output pair having a first signal and a second signal;
    a second delayed clock output pair having a first signal and a second signal;
    a first phase offset control; and
    a second phase offset control; and wherein:
        the first phase offset control is coupled to the first clock output pair;
        the second phase offset control is coupled to the second clock output pair; and
        the first phase offset control is operable to independently adjust the phase of the first clock output pair;
        the second phase offset control is operable to independently adjust the phase of the second clock output pair.

7. The DLL of claim 6 wherein:
    the phase of the first signal and of the second signal from the first clock output pair is adjusted by approximately a same amount; and
    the phase of the first signal and of the second signal from the second clock output pair is adjusted by approximately a same amount.

8. The DLL of claim 1 wherein:
    the variable delay circuit is configured in a first mode to output a plurality of delayed clock output pairs, having a constant phase offset from each other; and
    the phase adjustment circuit is configured to:
        receive the plurality of delayed clock output pairs from the variable delay circuit; and
        output a plurality of subsequent clock output pairs from the variable delay circuit having a constant phase offset.

9. The DLL of claim 1 wherein:
    the variable delay circuit is configured in a second mode to output a plurality of delayed clock output pairs, having a variable phase offset from each other; and the phase adjustment circuit is configured to:
receive the plurality of delayed clock output pairs from the variable delay circuit; and
output a plurality of subsequent clock output pairs from the variable delay circuit having a constant phase offset.

10. The DLL of claim 1 wherein:
the variable delay circuit is configured in a third mode to output a plurality of delayed clock output pairs, having a constant phase offset from each other; and
the phase adjustment circuit is configured to:
receive the plurality of delayed clock output pairs from the variable delay circuit; and
output a plurality of subsequent clock output pairs from the variable delay circuit having a variable phase offset.

11. The DLL of claim 1 wherein:
the variable delay circuit is configured in a fourth mode to output a plurality of delayed clock output pairs, having a variable phase offset from each other; and
the phase adjustment circuit is configured to:
receive the plurality of delayed clock output pairs from the variable delay circuit; and
output a plurality of subsequent clock output pairs from the variable delay circuit having a variable phase offset.

12. A method of operating a delay-locked loop (DLL) circuit, the method comprising:
generating a plurality of delayed clock output pairs from a variable delay circuit, wherein each of the delayed clock output pairs comprises a first signal and a second signal having a phase offset from each other; and
adjusting a phase of each of the delayed clock output pairs separately with respect to each other, via an adjustment circuit coupled to the variable delay circuit.

13. The method of claim 12 wherein:
the first signal and the second signal generated for each of the plurality of delayed clock output pairs has a phase offset that is constant.

14. The method of claim 13 wherein:
the constant phase offset between the first signal and the second signal of each of the clock output pairs is approximately 180 degrees.

15. The method of claim 12 further comprising:
controlling independently each of the phase offsets to each of the plurality of clock output pairs.

16. The method of claim 12 further comprising:
receiving a first clock output pair having a first signal and a second signal;
receiving a second clock output pair having a first signal and a second signal;
receiving a first phase offset control at the first clock output pair to independently adjust the phase of the first clock output pair; and
receiving a second phase offset control at the second clock output pair to independently adjust the phase of the second clock output pair.

17. The method of claim 16 wherein:
adjusting the phase of the first signal and of the second signal from the first clock output pair approximately a same amount;
adjusting the phase of the first signal and of the second signal from the second clock output pair approximately a same amount; and
the amount of phase adjustment to the first clock output pair can be different than the amount of phase adjustment to the second clock output pair.

18. The method of claim 12 further comprising:
configuring the variable delay circuit as a first mode to output a plurality of delayed clock output pairs, having a constant phase offset from each other; and
configuring the phase adjustment circuit to:
receive the plurality of delayed clock output pairs from the variable delay circuit; and
output a plurality of subsequent clock output pairs from the variable delay circuit having a constant phase offset.

19. The method of claim 12 wherein:
configuring the variable delay circuit as a second mode to output a plurality of delayed clock output pairs, having a variable phase offset from each other; and
configuring the phase adjustment circuit to:
receive the plurality of delayed clock output pairs from the variable delay circuit; and
output a plurality of subsequent clock output pairs from the variable delay circuit having a constant phase offset.

20. The method of claim 12 wherein:
configuring the variable delay circuit as a third mode to output a plurality of delayed clock output pairs, having a constant phase offset from each other; and
configuring the phase adjustment circuit to:
receive the plurality of delayed clock output pairs from the variable delay circuit; and
output a plurality of subsequent clock output pairs from the variable delay circuit having a variable phase offset.

21. The method of claim 12 wherein:
configuring the variable delay circuit as a fourth mode to output a plurality of delayed clock output pairs, having a variable phase offset from each other; and
configuring the phase adjustment circuit to:
receive the plurality of delayed clock output pairs from the variable delay circuit; and
output a plurality of subsequent clock output pairs from the variable delay circuit having a variable phase offset.

22. A system comprising:
means for generating a plurality of delayed clock output pairs from a variable delay circuit, wherein each of the clock output pairs comprises a first signal and a second signal having a phase offset from each other; and
means for adjusting a phase of each of the delayed clock output pairs separately with respect to each other, via an adjustment circuit coupled to the variable delay circuit.

23. The system of claim 22, further comprising:
means for adjusting the phase of the first signal and of the second signal from the first clock output pair approximately a same amount;
means for adjusting the phase of the first signal and of the second signal from the second clock output pair approximately a same amount; and
means for the amount of phase adjustment to the first clock output pair can be different than the amount of phase adjustment to the second clock output pair.

* * * * *